United States Patent [19]
Wagner

[11] Patent Number: 5,915,121
[45] Date of Patent: Jun. 22, 1999

[54] INTEGRATED CIRCUIT CONFIGURATION FOR REDUCING CURRENT CONSUMPTION

[75] Inventor: Wolfgang Wagner, München, Germany

[73] Assignee: Siemens Aktiengesellschaft, Munich, Germany

[21] Appl. No.: 08/841,120

[22] Filed: Apr. 29, 1997

[30]  Foreign Application Priority Data

Apr. 29, 1996 [DE] Germany .................. 196 17 172

[51] Int. Cl.⁶ ..................................................... G06F 1/32
[52] U.S. Cl. ...................... 395/750.06; 395/750.01; 395/750.03; 395/750.08
[58] Field of Search ............................ 395/750.06, 750.08, 395/750.01, 750.03, 872; 711/145, 151, 152, 163

[56] References Cited

U.S. PATENT DOCUMENTS 5,307,324  4/1994  Nishimoto ........................... 365/233.5
5,369,611  11/1994  Miura ................................. 365/189.05

*Primary Examiner*—Ayaz R. Sheikh
*Assistant Examiner*—Ario Etienne
*Attorney, Agent, or Firm*—Herbert L. Lerner; Laurence A. Greenberg

[57] ABSTRACT

An integrated circuit configuration has a multiplicity of function units which are connected to one another through a bus. An intermediate memory unit that is activated by a control signal is connected between the bus lines and the respective function unit. The function unit is then connected to the respective bus lines only when it is triggered.

5 Claims, 1 Drawing Sheet

INTEGRATED CIRCUIT CONFIGURATION FOR REDUCING CURRENT CONSUMPTION

BACKGROUND OF THE INVENTION

Field of the Invention

The invention relates to an integrated circuit configuration for reducing current consumption, having a multiplicity of function units which are connected to one another through bus lines, wherein data and/or addresses and control signals are transmitted over the bus lines.

Current saving modes are increasingly demanded in integrated circuit configurations, especially LSI (large-scale integrated) microprocessors and microcontrollers. Siemens Microcontrollers Data Catalog 1990 describes the Siemens 16-bit microcontroller SAB 80C166 on page 465 ff.. It has a current-saving mode which is activated by software, during which a supply voltage of only more than 2.5 V is needed. FIG. 3 on page 471 shows a block circuit diagram of that microcontroller. As can be seen therein, a multiplicity of internal function units are connected to the central processor through respective bus lines.

The disadvantage of such internal function units, which are discussed in more detail below with regard to FIG. 1, is that they are permanently connected to the bus of the central processor and thus process signals present on bus lines that lead from and/or to the central processor. In CMOS circuits, current is consumed precisely due to such switching of the signals and is dictated partly by cross current but primarily by charge reversal of load capacitors.

SUMMARY OF THE INVENTION

It is accordingly an object of the invention to provide an integrated circuit configuration, which overcomes the hereinafore-mentioned disadvantages of the heretofore-known devices of this general type and which reduces the current consumption of LSI CMOS circuits.

With the foregoing and other objects in view there is provided, in accordance with the invention, an integrated circuit configuration for reducing current consumption, comprising a multiplicity of function units having inputs; bus lines interconnecting the function units for transmitting data and/or addresses and control signals; and at least one intermediate memory unit connected between the bus lines and a respective one of the function units for reducing current consumption; the intermediate memory unit controlling signals on the bus lines as a function of an associated control signal, for switching the signals of the bus lines through to the one function unit when the control signal is activated, and transmitting none of the bus line signals to the one function unit when the control signal is not activated, so that respective inputs of the one function unit are not activated.

The advantage of the present invention is that only those function units in an LSI component, such as a microprocessor or a microcontroller, having results which are required on the respective output lines, are activated. All of the other function units are decoupled from the central bus from that moment on.

In accordance with another feature of the invention, the function units have outputs, and the control signal is derived from an enable signal for the outputs of the function units. The enable signal of the respective output drivers of those function units can be used for decoupling the function units. To that end, advantageously, a simple latch can be used that is connected between the central bus and the respective function unit.

In accordance with a further feature of the invention, the integrated circuit configuration is a microprocessor, and one of the function units is a ROM.

In accordance with an added feature of the invention, the intermediate memory unit is a latch.

In accordance with a concomitant feature of the invention, the intermediate memory unit is a transfer gate. The latch can advantageously include a simple transfer gate.

Other features which are considered as characteristic for the invention are set forth in the appended claims.

Although the invention is illustrated and described herein as embodied in an integrated circuit configuration for reducing current consumption, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
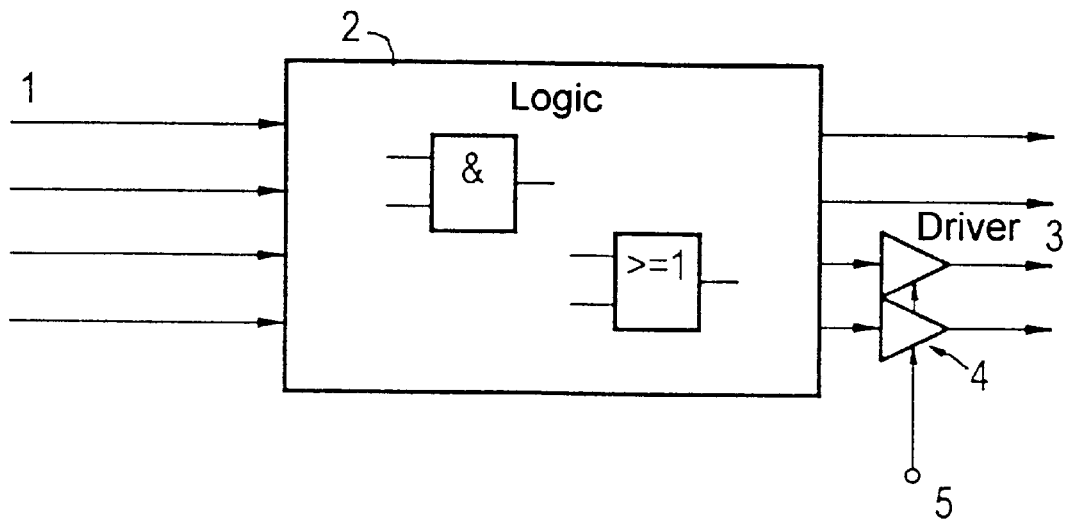
FIG. 1 is a schematic and block diagram of a circuit configuration of the prior art for triggering a function unit.

Referring now to the figures of the drawings in detail and first, particularly, to FIG. 1 thereof, there is seen a basic wiring of internal function units according to the prior art which are connected to a central processor through respective bus lines. Reference numeral 1 indicates the bus lines that lead from and/or to the central processor. Reference number 2 indicates a function unit that contains logic and drivers, etc.. An output of the function unit 2 is connected through drivers 4, only two of which are shown as examples, to external output lines 3. The drivers 4 are activated through a line 5 by a control or trigger signal. The disadvantage of the illustrated configuration is that the function units are permanently connected to the bus 1 of the central processor and thus process the signals present on the lines 1. In CMOS circuits, current is consumed precisely from such switching of the signals. That is dictated partly by cross current but primarily by charge reversal of load capacitors.

Since the results on the output lines of circuit elements are not significant at every moment in time in a complex component such as a microcontroller, according to the invention only that function unit which is connected to the central processor is activated at that particular time. A microprocessor has a plurality of processing units, for instance, such as adding mechanisms and shift units, etc.. Depending on the command, the result of only one unit at a time is important and is processed further. However, since the operands are present in parallel at the inputs of all of the units, and those operands vary continuously from one command to another, switching back and forth to the respectively connected logic circuit is carried out in the individual units even though the result of that particular unit is not needed. In CMOS circuits, only the switching of the signals consumes current. That is dictated by the cross current and primarily by the charge reversal of the load capacitors.

Figure 2:
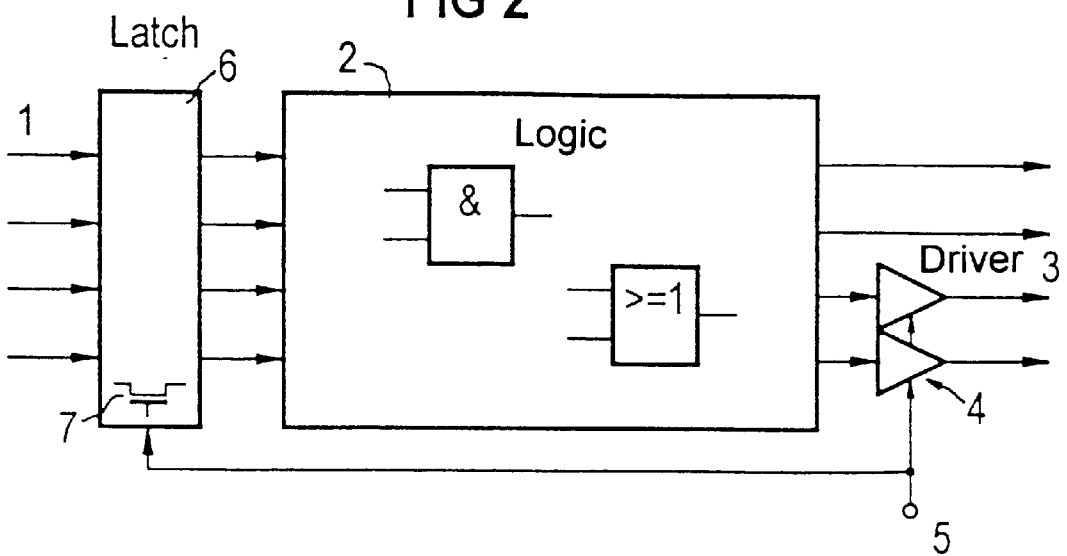
FIG. 2 is a schematic and block diagram of a circuit configuration according to the invention.

A remedy therefor is provided in FIG. 2, wherein a latch 6 is connected upstream of each function unit. In FIG. 2, only one function unit 2 is shown, and the internal central bus is represented by four lines 1. A latch 6 which is connected between this internal bus 1 and the logic unit 2 is triggered by the trigger signal on the line 5 that is typically used to trigger the output drivers 4. However, its own trigger signal may also be used.

Through the use of this latch 6 at the inputs of a function unit 2, it is possible to connect the latch 6 to memories through the control signal line 5 of the latch 6 if the result is not needed, thus no switching takes place within the unit 2 and thus no current, with the exception of leakage currents, but those are very much smaller.

Since in most cases the function units 2 have external driver stages 4 which are triggered by a control signal on the line 5 that causes the result to be carried onward, this signal can also switch the latch 6 transparently, whereupon this unit exhibits its full function as needed. If the latch 6 is not activated, then no unnecessary current is consumed. FIG. 2 shows a transfer gate 7 in the intermediate memory unit as an example for the lowermost of the bus lines 1. This represents the simplest way of decoupling the function unit from the bus 1. The latch 6 or the transfer gate 7 may be an intermediate memory unit.

The 16-bit microcontroller SAB 80C166 mentioned above has essentially five processing units. If a current saving circuit according to the invention is employed, then the total current consumption of these units can be lowered to approximately one-fifth, on the assumption that all of the units consume approximately the same amount of current.

A particular advantage of this circuit according to the invention is that the user need not start or end current saving by some artificial command, but instead this saving occurs automatically. Therefore current is saved in all of the function units, not only in the applications in which the developers activate the current saving modes, or in other words turn off function units purposefully through the use of software.

Another advantage is that microcontrollers with integrated ROM are often sold as microcontrollers without ROM. That happens especially if the ROM is unusable because of production defects. The result is a variable current consumption in microcontrollers without ROM as compared with microcontrollers having a defective ROM. If such a microcontroller is provided with a circuit configuration according to the invention, then because of the provisions described above the ROM no longer consumes any current, and there is no longer any difference in current consumption as compared with the genuine ROMless microcontroller.

I claim:

1. An integrated circuit configuration for reducing current consumption, comprising:

a multiplicity of function units having inputs;

bus lines interconnecting said function units for transmitting at least one of data and addresses as well as control signals; and at least one intermediate memory unit connected between said bus lines and a respective one of said function units for reducing current consumption;

said intermediate memory unit controlling signals on said bus lines as a function of an associated control signal, for switching the signals of said bus lines through to said one function unit when the control signal is activated, and transmitting none of the bus line signals to said one function unit when the control signal is not activated, so that respective inputs of said one function unit are not activated.

2. The integrated circuit configuration according to claim 1, wherein said function units have outputs, and the control signal is derived from an enable signal for said outputs of said function units.

3. The integrated circuit configuration according to claim 1, wherein the integrated circuit is a microprocessor, and one of said function units is a ROM.

4. The integrated circuit configuration according to claim 1, wherein said intermediate memory unit is a latch.

5. The integrated circuit configuration according to claim 1, wherein said intermediate memory unit includes a transfer gate.

* * * * *